United States Patent
Kubota et al.

(10) Patent No.: US 7,026,231 B2
(45) Date of Patent: Apr. 11, 2006

(54) METHOD OF PRODUCING ORGANIC SEMICONDUCTOR DEVICE INCLUDING STEP OF APPLYING OXIDIZING AGENT SOLUTION TO MONOMER LAYER TO OBTAIN POLYMER LAYER

(75) Inventors: Makoto Kubota, Kanagawa (JP); Motokazu Kobayashi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/479,364

(22) PCT Filed: Feb. 4, 2003

(86) PCT No.: PCT/JP03/01096

§ 371 (c)(1),
(2), (4) Date: Dec. 2, 2003

(87) PCT Pub. No.: WO03/067680

PCT Pub. Date: Aug. 14, 2003

(65) Prior Publication Data
US 2004/0152230 A1   Aug. 5, 2004

(30) Foreign Application Priority Data
Feb. 6, 2002   (JP) ............................. 2002-029793

(51) Int. Cl.
*H01L 21/3205* (2006.01)
(52) U.S. Cl. .................. 438/586; 438/99; 438/590; 438/592; 438/593; 438/610; 438/660; 438/674; 252/500; 525/92
(58) Field of Classification Search ............. 438/586, 438/590, 592, 610, 658, 660, 674, 99, 593; 252/500; 525/92
See application file for complete search history.

(56) References Cited

U.S. PATENT DOCUMENTS

| | | | |
|---|---|---|---|
| 4,710,401 A | | 12/1987 | Warren, Jr. et al. |
| 5,385,956 A | * | 1/1995 | Schellekens et al. ........ 522/116 |
| 5,735,729 A | | 4/1998 | Kobayashi et al. |
| 6,117,554 A | * | 9/2000 | Shalaby et al. ............. 428/420 |
| 6,605,236 B1 | * | 8/2003 | Smith et al. ................ 252/500 |
| 2003/0180451 A1 | * | 9/2003 | Kodas et al. ................ 427/123 |

FOREIGN PATENT DOCUMENTS

EP   1 054 414 A1   11/2000

OTHER PUBLICATIONS

Szczech et al. "Fine-line Conductor Manufacturing Using Drop-On-Demand PZT Printing Technology", IEEE Transactons on Electronics Packaging Manufacturing, vol. 25, No. 1, pp. 26-33, Jan. 2002.*

(Continued)

*Primary Examiner*—George Fourson
*Assistant Examiner*—Thanh V. Pham
(74) *Attorney, Agent, or Firm*—Fitzpatrick, Cella, Harper & Scinto

(57) ABSTRACT

There is provided a method of producing an organic semiconductor device by which an organic semiconductor device having an optional configuration can easily be produced.

A method of producing an organic semiconductor device comprising a gate insulating layer, a gate electrode, a source electrode, a drain electrode, and an organic semiconductor layer is provided which comprises the steps of:

1) forming a monomer layer of a conductive polymer precursor;

2) maintaining the monomer layer at a given temperature; and 3) applying an oxidizing agent solution to a desired location of the monomer layer to obtain a polymer layer of a desired conductivity.

6 Claims, 3 Drawing Sheets

OTHER PUBLICATIONS

F. Garnier, et al., "All-Polymer Field-Effect Transistor Realized by Printing Techniques," Science, vol. 265, (1994), pp. 1684-1686.

H. Koezuka, et al., "Polythiophene field-effect transistor with polypyrrole worked as source and drain electrodes," Appl. Phys. Lett., 62(15), (1993), pp. 1794-1796.

H. Fuchigami, et al., "Polythienylenevinylene thin-film transistor with high carrier mobility," Appl. Phys. Lett., 63(10), (1993), pp. 1372-1374.

G. Horowitz, et al. "An analytical model for organic-based thin-film transistors," J. Appl. Phys., 70(1), (1991), pp. 469-475.

G. Horowitz, et al. "Thin-Film Transistors based on Alpha-Conjugated Oligomers," 42-43, (1991), pp. 1127-1130.

Kang H.C. et al., "Enhanced electrical conductivity of polypyrrole prepared by chemical oxidative polymerization: effect of the preparation technique and polymer additive," Polymer, Aug. 2000, vol. 41, No. 18, pp. 6931-6934.

* cited by examiner (CHANNEL LENGTH : 50 μm)
(CHANNEL WIDTH : 1mm)

OXIDIZING AGENT APPLIED

METHOD OF PRODUCING ORGANIC SEMICONDUCTOR DEVICE INCLUDING STEP OF APPLYING OXIDIZING AGENT SOLUTION TO MONOMER LAYER TO OBTAIN POLYMER LAYER

TECHNICAL FIELD

The present invention relates to a method of producing an organic semiconductor device.

BACKGROUND ART

In recent years, IC technologies using organic semiconductor devices have attracted people's attention. The main appeals thereof are a simple production process steps (low cost), and compatibility with flexible substrates. From these advantages, the applications of organic semiconductor devices are expected as plastic circuits, electronic tags, drive circuits for displays, and the key devices for memories.

In general, an organic semiconductor device is constituted of a substrate, a gate electrode, a gate insulating film, a source electrode, a drain electrode, and an organic semiconductor film, and is utilized as a thin film field effect transistor (FET) and the like. When a voltage applied to the gate electrode (gate voltage: $V_G$) is changed, charge of an interface between the gate insulating film and the organic semiconductor film becomes excessive or deficient, and the drain-source current value ($I_{ds}$) flowing between the source electrode, the organic semiconductor, and the drain electrode changes to enable switching.

The term "organic semiconductor" as herein employed is intended to embrace those materials that contain carbon or an allotrope of carbon and have a mobility of charge carriers of at least $10^{-3}$ $cm^2$/Vsec at room temperature (20° C.).

Over past 10 years, IC technologies using organic semiconductor thin film transistor (TFT) have been proposed. The major appeal of these circuits stems from expectation in the ease of processing and the compatibility with flexible substrates. These advantages are expected for the use in low-cost IC technologies suited to applications, such as smart cards, electronic tags, and displays.

Reports on the results of heretofore researches and developments include F. Garnier et al., Science, Vol. 265, pp. 1684–1686; H. Koezuka et al., Applied Physics Letters, Vol. 62 (15), pp. 1794–1796; H. Fuchigami et al., Applied Physics Letters, Vol. 63 (10), pp. 1372–1374; G. Horowitz et al., Applied Physics Journal, Vol. 70 (1), pp. 469–475; and G. Horowitz et al., Synthetic Metals, Vols. 42–43, pp. 1127–1130. Devices described in these references use polymers or oligomers as active materials, unlike amorphous silicon and polysilicon TFT structures developed in the initial stage. The devices are generally field effect transistors (FETs).

Organic polymer devices have significant advantages of simple processing and resultant low cost in comparison with inorganic semiconductor devices. In addition, since organic polymer devices have compatibility with polymer substrates, which excel in workability and plasticity, devices having flexible structures can be easily formed. In such cases, due to the compatibility of the coefficient of thermal expansion with the substrates, stress to the bonding interface is smaller than the stress to an inorganic semiconductor/polymer substrate.

Well-known organic compounds exhibiting characteristics as semiconductors, used in devices include low-molecular compounds such as phthalocyanines, and π-conjugated oligomers and π-conjugated high-molecular compounds such as polythiophene. These organic semiconductor compounds form band structures consisting of a valence band, a conduction band, and a forbidden band like inorganic semiconductors, and oxidization or reduction (doping) by chemical or physical means forms carriers for carrying electric charge. Such organic semiconductor compounds can be applied to various devices, and several reports have hitherto been published.

Circuits utilizing organic semiconductor devices have a subject of improvement of the integration density, and require fine patterning of organic semiconductor films and electrodes. However, since conventional producing methods using printing or optical patterning require much labor and cost for fabricating screens and metal masks, they are not suited to applications wherein various kinds of design circuits optimized for various uses are produced in small quantities at low cost.

DISCLOSURE OF INVENTION

The present invention has been accomplished in view of the problems as described above, and it is, therefore, an object of the present invention to provide a method of producing an organic semiconductor device by which an organic semiconductor device having a desired configuration can easily be produced.

In order to achieve the above-described object, the present invention provides a method of producing an organic semiconductor device comprising a gate insulating layer, a gate electrode, a source electrode, a drain electrode, and an organic semiconductor layer, the method comprising the steps of:

1) forming a monomer layer of a conductive polymer precursor;

2) maintaining the monomer layer at a given temperature; and 3) applying an oxidizing agent solution to a desired location of the monomer layer to obtain a polymer layer of a desired conductivity.

BEST MODE FOR CARRYING OUT THE INVENTION

Figure 1:
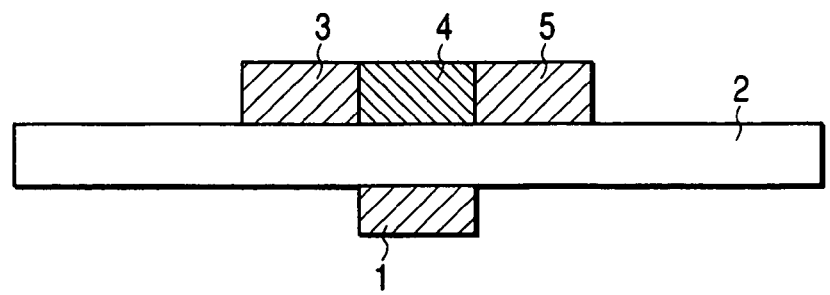
FIG. 1 is an enlarged vertical sectional view schematically showing a part of an organic semiconductor device consisting of a gate insulating layer, a gate electrode, a source electrode, a drain electrode, and an organic semiconductor layer.

A general constitution of a TFT obtained by the present invention is shown in FIG. 1. The TFT has a gate electrode 1, a gate-insulating layer 2, a source electrode 3, an organic semiconductor material 4, and a drain electrode 5.

Although the present invention will be described below referring to FIG. 1, the feature of the present invention is to produce an organic semiconductor device having an optional configuration, and the constitution and configuration of the device is in no way limited to those shown in FIG. 1.

Figure 2:
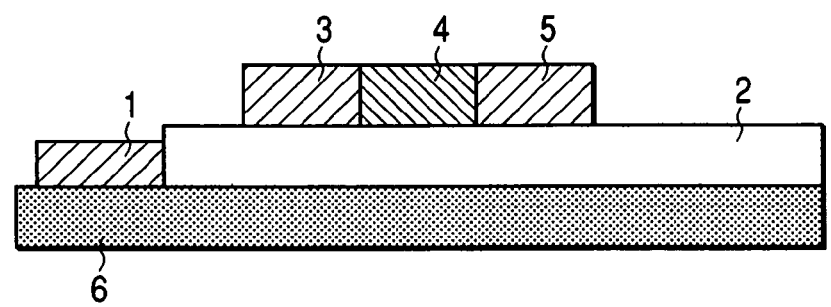
FIG. 2 is an enlarged vertical sectional view schematically showing a part of an organic semiconductor device consisting of a gate insulating layer, a gate electrode, a source electrode, a drain electrode, and an organic semiconductor layer.
Figure 3:
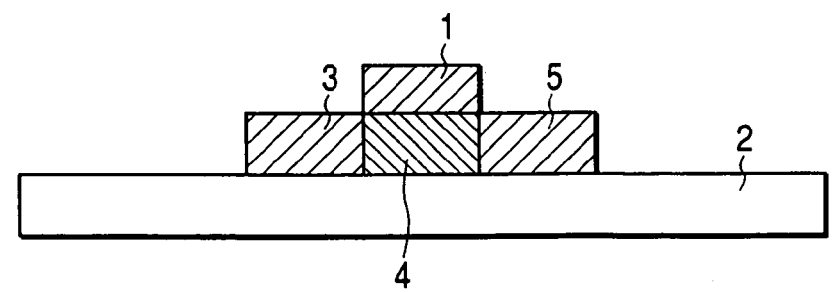
FIG. 3 is an enlarged vertical sectional view schematically showing a part of an organic semiconductor device consisting of a gate insulating layer, a gate electrode, a source electrode, a drain electrode, and an organic semiconductor layer.

For example, as shown in FIG. 2, the device has a structure wherein a gate-insulating film 2 is formed on a conventional substrate material 6, such as glass, silicon, and plastics so that the gate electrode 1contacts the gate-insulating film 2 on the substrate; or as shown in FIG. 3, the gate electrode 1 may be disposed on the upper portion of the organic semiconductor layer 4.

For the gate-insulating layer 2, an organic material or an inorganic material having a conductivity of about $10^{-12}$ S/cm or less is used.

Examples of the organic insulating material include polyimide, polyester, polymethyl methacrylate (PMMA), and so on. The gate-insulating layer in the present invention may be an organic insulating material coated on the substrate 6 as shown in FIG. 2, or a single organic insulating material may also be used as the substrate (structural material) as shown in FIG. 1.

The gate-insulating layer 2 can also be formed of an inorganic material, such as silicon dioxide ($SiO_2$), silicon nitride ($Si_3N_4$), and aluminium oxide ($Al_2O_3$), using a well-known conventional method.

The monomer used in the present invention is a precursor monomer of a conductive polymer, and an oxidizing agent acts as a polymerizing catalyst by bringing an oxidizing agent solution into contact with the monomer layer at a constant temperature to obtain a conductive resin layer. The conductive resin layer can be used in the device as an organic semiconductor 4 or source/drain electrodes 3, 5.

Examples of the precursor monomer of a conductive polymer include a pyrrole-type compound (hereinafter, simply referred to as "pyrrole compound"), a thiophene-type compound (hereinafter, simply referred to as "thiophene compound"), and an aniline-type compound(hereinafter, simply referred to as "aniline compound").

Normally, however, unsubstituted pyrrole is a particularly preferable material in view of the controllability of conductivity, adhesion strength of the film, and the accuracy of patterning.

Since the conductivity of the polypyrrole compound including a polymer of the unsubstituted pyrrole can be controlled in an especially wide range by the reaction temperature during polymerization, the polypyrrole compound is most suitable as a material to selectively form either the semiconductor portion or the electrode portion in the present invention.

When an oxidizing agent is added to pyrrole monomers, a polymerization reaction starts. If the reaction temperature is low at this time, the polymerization of pyrrole proceeds in the 2- and 5-positions of pyrrole, with the result that a polymer having a long chain of conjugated double bonds, i.e., having a high conductivity, is obtained. On the contrary, if the reaction temperature is high, since the polymerization proceeds also in the 3- and 4-positions, in addition to the 2- and 5-positions, a polymer having a short chain of conjugated double bonds, i.e., having a medium or high resistance, is obtained.

Although the correlation between the reaction temperature and the conductivity differs depending on the degree of substitution of the pyrrole monomers, the kind and concentration of the oxidizing agent solution, when unsubstituted pyrrole is used as the monomer, and a 0.25 mol/L aqueous solution of iron (III) chloride is used as the oxidizing agent solution, a polymer of the conductor region having an electric conductivity of 10 $S \cdot cm^{-1}$ or more, suitable to the electrode applications is obtained in a low-temperature region of a reaction temperature of about −50° C. to about 0° C.; and a polymer of the semiconductor region having an electric conductivity of $10^{-5}$ to $10^{-2}$ $S \cdot cm^{-1}$ is obtained in a high-temperature region of a reaction temperature of about 15° C. to about 70° C.

As is the case with the unsubstituted pyrrole, when another pyrrole compound is used in the present invention, since the conductivity varies depending on the polymerization site, a great care must be taken to the positions of the substituents. By the utilization of such characteristics, the conductivity of the obtained polymer can be lowered, or controlled more precisely.

Pyrrole compounds suitable to the present invention for the above-described object include 3,5-substituted pyrroles (e.g., 3,5-dimethylpyrrole, etc.), 3,4-substituted pyrroles (e.g., 4-methylpyrrole-3-carboxymethyl, etc.), N-substituted pyrroles (e.g., N-methylpyrrole, etc.), and 3-substituted pyrroles (e.g., 3-methylpyrrole, 3-chlorothiophenes, 3,4-dichlorothiophenes, and the like. 3-octylpyrrole, etc.).

Compounds suitable as the thiophene compound include 3-alkylthiophenes, 3,4-dialkylthiophenes, 3-alkoxythiophenes, 3,4-dialkoxythiophenes, and the like.

The aniline compound in the present invention include unsubstituted aniline and substituted compounds thereof, and 6-member ring aromatic compounds having structures similar thereto, and examples thereof include aniline, toluidine, chloroaniline, and benzidine.

In order to control the strength and conductivity of the obtained polymer, the pyrrole compound, the thiophene compound, and the aniline compound as described above can be used in combination; and other conductive polymers or polymerizable monomers may be added as required for the purpose of modification.

The addition of an oxidizing agent to the monomers as described above causes chemical oxidation polymerization, to form a conductive polymer having conjugated double bonds, such as polypyrrole, polyaniline, and polythiophene.

In the conventional chemical oxidation polymerization carried out in a solution, since a conductive polymer was obtained in a powder form, and the polymer skeleton was formed of conjugated double bonds, it was difficult to form a uniform film on a solid surface. Moreover, since such an oxidizing agent suited to polymerization was ionic and had a low solubility to organic solvents for dissolving the monomers, the reaction was uneven, thereby lowering the conductivity of the polymer.

However, in the present invention, since a solution of an ionic oxidizing agent is applied to a previously formed monomer film, there is obtained the advantage that the degree of mixing of the monomer with the oxidizing agent is good, and a film-shape polymer can easily be formed.

The method of applying the monomer layer is not specifically limited, and the monomer itself or a solution of the monomer is applied using commonly used coating methods, such as the spin coating method, the casting method, the spraying method, the doctor blade method, the die coating method, the dipping method, the printing method, and so on. Of these methods, the preferable methods are the spin coating method, the casting method, and the spraying method. When a solvent is used, the solvent is selected considering the solubility and stability of the monomer used. If a solvent having a poor compatibility with the oxidizing agent solution later applied to the monomer coating layer is contained, the solvent is removed by drying after application, and in this case, such heating as to start polymerization of the monomer layer must be avoided.

Although the thickness of the monomer layer is not specifically limited, the thickness is preferably 30 nm to 3,000 nm. If the monomer layer is thinner than 30 nm, there arise the problems that the oxidizing agent solution adheres to locations other than the aimed location, and defects are liable to be formed in the obtained polymer film; and if the monomer layer is thicker than 3,000 nm, there arise the problems that the mixing of the monomer with the oxidizing agent is insufficient, and the cost increases.

Although the monomer layer can easily be patterned by applying an oxidizing agent solution to the desired location as described below, in order to avoid the coating of the monomer material on the entire surface of the material to be coated, the discharge and application of the monomer layer while effecting patterning using an ink jet system is also possible. In this case, the viscosity of the monomer solution is adjusted to about 1–30 cp so as to allow the monomer solution to be discharged from a recording head of the ink jet system. The ink jet system may be either a piezo-jet system or a bubble-jet system.

The kind and concentration of the oxidizing agent in the oxidizing agent solution is suitably selected depending on the material and thickness of the monomer layer. However, if the concentration of the oxidizing agent is excessively high (e.g., more than 1 mol/L), nonuniform polymer films are often formed with poor reproducibility; therefore, it should be avoided.

The solvent for the oxidizing agent solution is selected from those solvents that are difficult to be subjected to oxidization reactions and can dissolve the oxidizing agent, and include acetonitrile, water, aliphatic alcohols such as methanol, ethanol, propanol, butanol, pentanol, hexanol, octanol, and ethylene glycol; ethers such as diethylether and dibutylether; halogenated hydrocarbons such as chloroform, dichloromethane, 1,1-dichloroethane, and 1,1-dichloroethylene; aromatic compounds and derivatives thereof such as benzene and 4-chloropyridine; aprotic polar solvents such as N,N-dimethylformamide and N,N-dimethylacetamide; esters such as methyl acetate and ethyl acetate; and nitro compounds such as nitromethane, nitroethane, and nitrobenzene.

When the monomer is a pyrrole compound or a thiophene compound, the suitable oxidizing agents include iron (III) salts (ferric salts) such as iron (III) chloride, iron (III) bromide, iron (III) iodide, and iron (III) perchlorate; ruthenium (III) salts such as ruthenium trichloride, ruthenium tribromide, ruthenium triiodide, and ruthenium triperchlorate; and molybdenum (V) salts such as molybdenum pentachloride and molybdenum pentabromide; as well as inorganic halides such as aluminium chloride, aluminium chloride/copper (II) chloride, and titanium tetrachloride; and protonic acids such as hydrochloric acid, sulfuric acid, hydrofluoric acid, perchloric acid, trichloroacetic acid, trifluoroacetic acid, and phosphoric acid.

Of these oxidizing agents, in view of the reactivity, economical efficiency, and ease of handling, when the monomer is the pyrrole compound, the oxidizing agent is preferably an aqueous solution of an iron (III) compound represented by the general formula: $Fe_mX_n$, wherein X is $Cl^-$, $Br^-$, $I^-$, $ClO_4^-$, $BF_4^-$, $PF_6^-$, $SbF_6^-$, $CH_3C_6H_4SO_3^-$, $CF_3SO_3^-$, $ZrF_6^{2-}$, $TiF_6^{2-}$, or $SiF_6^-$; and m and n are independently an integer of 1–3.

Specifically, it is preferable to use an aqueous solution of $FeCl_3$, $FeBr_3$, $FeI_3$, $Fe(ClO_4)_3$, $Fe(BF_4)_3$, $Fe(PF_6)_3$, $Fe(SbF_6)_3$, $Fe(CH_3C_6H_4SO_3)_3$, $Fe(CF_3SO_3)_3$, $Fe_2(ZrF_6)_3$, $Fe_2(TiF_6)_3$, or $Fe_2(SiF_6)_3$. In particular, an aqueous solution of iron (III) chloride ($FeCl_3$) is preferred.

When the monomer is the aniline compound, the oxidizing agent includes chromates (IV), dichromates (VII), and permanganates (VII).

Although the quantity of the oxidizing agent used is normally 0.01 to 100 mols to 1 mol of the monomer, quantitative polymerization reaction occurs when about 2 mols to about 3 mols of the oxidizing agent is used for 1 mol of the monomer. If an oxygen radical source such as oxygen in the air, hydrogen peroxide or ozone is used as an auxiliary oxidizing agent, the quantity of the chemical oxidizing agent used can be reduced accordingly.

A small quantity of non-oxidative components such as a conductive agent, a stabilizer, a surface-active agent, an anti-foaming agent, a UV absorbing agent, a dye, and a pigment may be added to the oxidizing agent solution depending on the purpose.

In order to raise the conductivity of the polymer, especially to raise the initial conductivity and aging stability, the combined use of a dopant for the polymerization of the monomers is also possible as required. The dopant is used under the condition of pH 1 to 5, preferably pH 1 to 3. Suitable dopants include, for example, p-toluene sulfonic acid, benzene sulfonic acid, monochlorobenzene sulfonic acid, dichlorobenzene sulfonic acid, trichlorobenzene sulfonic acid, trifluoromethane sulfonic acid, anthraquinone sulfonic acid, anthraquinone disulfonic acid, naphthalene sulfonic acid, naphthalene disulfonic acid, naphthalene trisulfonic acid, naphtoquinone sulfonic acid, isopropylnaphthalene sulfonic acid, dodecylbenzene sulfonic acid, other aromatic sulfonic acids and the alkali-metal (e.g., sodium and potassium) salts or tetraethylammonium salts thereof; or perchloric acid and alkali-metal salts or tetraethylammonium salts thereof; and hydrochloric acid, sulfuric acid, nitric acid, and sulfosalicylic acid. Particularly, an aromatic sulfonic acid or an alkali-metal salt thereof is preferable.

Although a single dopant is normally added, a mixture of dopants may also be added. The quantity of the dopant used is normally 0.1 to 3 times the quantity of the monomer (in molar ratio); however, the quantity is not limited thereto. However, like the oxidizing agent, since use of an excessive quantity of the dopant results in the formation of nonuniform polymer films in poor reproducibility, it should be avoided.

Although the method of applying the oxidizing agent solution is not limited as long as the oxidizing agent solution can be applied to desired locations at high accuracy, it is preferable to use an ink-jet system. By using an ink-jet system, a desired quantity of the oxidizing agent solution can be discharged and applied to desired locations, and the application can be performed using such a small machine as used as a home printer. In that time, the oxidizing agent solution is adjusted to have a viscosity of about 1–30 cp so as to be discharged from a recording head of the ink-jet system. The ink-jet system may be either a piezo jet system or a bubble jet system.

When an ink-jet system is used for applying the oxidizing agent solution, the above-descried additive or dopant is not necessarily to be dissolved or dispersed in the oxidizing agent solution, but can be stored in a separate ink tank to effect discharge and application simultaneously with the discharge and application of the oxidizing agent solution.

When the oxidizing agent solution is applied to a desired location of the monomer layer, the constituents can be maintained at a given temperature to control the reactivity thereof. Since the conductivity of the polymer thus obtained can be controlled optionally, the present invention makes it possible to utilize this phenomenon to selectively form either the organic semiconductor portion 4 of a medium resistance or the conductive electrode portions 3, 5 as needed.

The correlation between the reaction temperature and the conductivity depends on the kind of the monomer used, and the kind and concentration of the oxidizing agent solution used. For example, when unsubstituted pyrrole and a 0.25 mol/L aqueous solution of iron (III) chloride are used, either of a polymer in a conductor region of an electric conductivity of 10 $S \cdot cm^{-1}$ or more and a polymer in a semiconductor region of an electric conductivity of $10^{-5}$ to $10^{-2}$ $S \cdot cm^{-1}$ can be formed selectively by changing the reaction temperature as described above.

If the conductivity of the obtained polymer is insufficient to use as the electrode of the device, the polymer can further be subjected to doping chemically and electrochemically to further enhance the conductivity thereof.

After the polymerization of the monomers at an oxidizing agent applied location has been completed, and the organic semiconductor portion 4 and conductive electrode portions 3, 5 have been obtained, a monomer portion to which the oxidizing agent solution has not been applied, and an excessive oxidizing agent must be washed and removed using a solvent or the like.

The source electrode 3 and the drain electrode 4 in the device are not necessarily to be fabricated by the reaction between the monomer layer and the oxidizing agent, but may be fabricated by using conventional metal electrodes, carbon electrode, or conductive polymer electrodes.

EXAMPLES

The present invention will be specifically described below referring to examples; however, the present invention is in no way limited within the range of these examples.

Example 1

Figure 4:
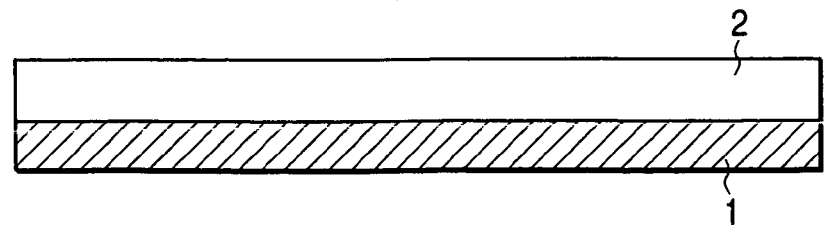
FIG. 4 is a vertical sectional view showing an example of the configuration of a substrate used in Examples 1 to 3 of the present invention, and is an enlarged view schematically showing a part of a conductive silicon substrate having a silicon dioxide film of a thickness of about 1 μm on one side thereof.

FIG. 4 is a schematic vertical section of a conductive silicon substrate having a silicon dioxide film of a thickness of about 1 μm on one side, which is commercially available. A device is constructed using the conductive silicon portion of the substrate as a gate electrode 1, and the silicon dioxide portion as a gate insulating film 2.

A 20% by weight ethanol solution of unsubstituted pyrrole was applied by the spin coating onto the substrate. The film thickness of the obtained monomer layer was about 200 nm.

Figure 5:
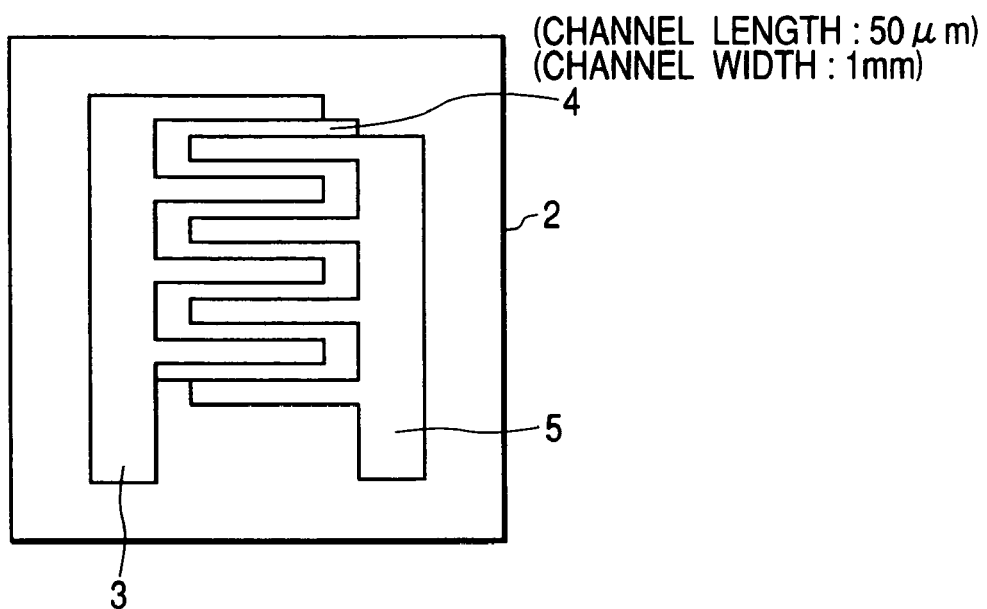
FIG. 5 is a plan view schematically showing an example of patterns used for fabricating an organic semiconductor device in Examples 1 to 3 of the present invention.
Figure 6:
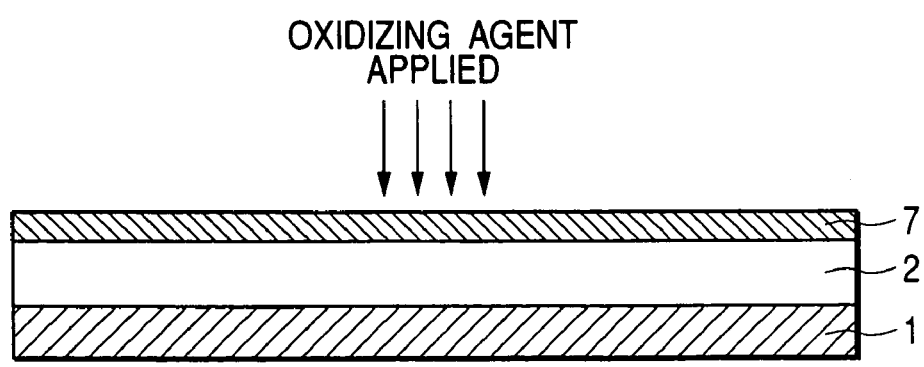
FIG. 6 is an enlarged vertical sectional view schematically showing the step for applying an oxidizing agent solution for forming an organic semiconductor portion in Example 1 of the present invention.

The entire substrate was heated to and maintained at 70° C., and following a pattern (an example is shown in FIG. 5) previously designed using a commercially available software, a 0.25 mol/L aqueous solution of iron (III) chloride as an oxidizing agent was discharged and printed at 4 $\mu L/cm^2$ on the monomer layer using a piezo-jet system. FIG. 6 shows a schematic diagram of this step. A polymerization reaction took place quickly immediately after the printing, and a blackened polymer film was obtained to be used as an organic semiconductor.

After non-reacted monomers were washed and removed with ethanol, an aqueous solution of PEDOT (poly-ethylenedioxythiophene) (Nagase ChemteX Corporation; trade name: Denatron P-502S; concentration: 3.0% by weight) as a conductive polymer was applied using a piezo-jet method to form source/drain electrodes.

The obtained organic semiconductor device had such a structure as shown in FIG. 1, and the measured value of the channel length between the source and drain was 51 μm.

Example 2

By following the same procedure as Example 1, a monomer layer of unsubstituted pyrrole was formed on a conductive silicon substrate having a silicon dioxide film on one side.

Figure 7:
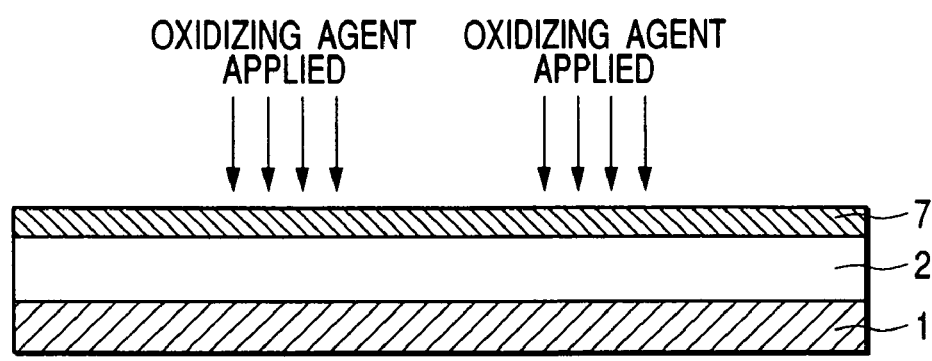
FIG. 7 is an enlarged vertical sectional view schematically showing the step for applying an oxidizing agent solution for forming an electrode portion in Example 2 of the present invention.

The entire substrate was maintained at 0° C., and following the same pattern as in Example 1, a 0.25 mol/L aqueous solution of iron (III) chloride as an oxidizing agent was discharged and printed at 4 $\mu L/cm^2$ using a piezo-jet system. FIG. 7 shows a schematic diagram of this step. A polymerization reaction took place quickly immediately after the application, and a blackened polymer film was obtained in ten odd seconds, for use as source/drain electrodes.

Figure 8:
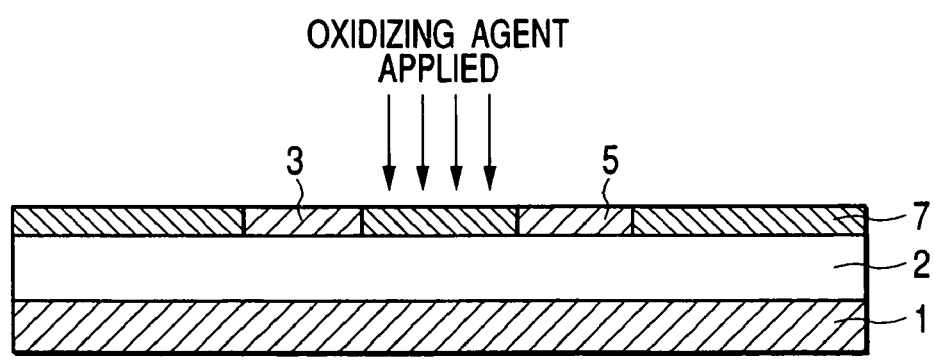
FIG. 8 is an enlarged vertical sectional view schematically showing the step for applying an oxidizing agent solution for forming an organic semiconductor portion in Example 2 of the present invention.

Next, the entire substrate was heated to and maintained at 70° C., and the aqueous solution of iron (III) chloride was discharged and. printed again at 4 $\mu L/cm^2$ using a piezo-jet system to form an organic semiconductor adjacent to the previously formed source/drain electrodes portion. The alignment at this time was performed using an optical detector installed on an ink-jet head. FIG. 8 shows a schematic diagram of this step.

Non-reacted monomers were washed and removed with ethanol.

The obtained organic semiconductor device had such a structure as shown in FIG. 1, and the measured value of the channel length between the source and drain was 48 μm.

Example 3

As in Example 1, a device was constructed using the conductive silicon portion of the substrate having a silicon dioxide film shown in FIG. 4 as a gate electrode 1, and the silicon dioxide portion as a gate insulating film 2.

A 10% by weight ethanol solution of unsubstituted pyrrole as the monomer and a 0.25 mol/L aqueous solution of iron (III) chloride as the oxidizing agent were stored in separate ink tanks of a piezo jet printer used for application.

The entire conductive silicon substrate was maintained at 0° C., and following the same pattern as in Example 1, the monomer solution (discharge quantity: 1.5 $\mu L/cm^2$) and the oxidizing agent solution (discharge quantity: 4 $\mu L/cm^2$) were simultaneously discharged and printed onto the same location. A polymerization reaction took place quickly immediately after the application, and a blackened polymer film was obtained in ten odd seconds, for use as an organic semiconductor.

Next, the entire substrate was heated to and maintained at 70° C., and the monomer solution and the oxidizing agent solution were discharged and printed using a piezo-jet system to form source/drain electrodes portion adjacent to the previously formed organic semiconductor portion. The alignment at this time was performed using an optical detector installed on an ink-jet head.

The obtained organic semiconductor device had such a structure as shown in FIG. 1, and the measured value of the channel length between the source and drain was 50 µm.

Example 4

As in Example 1, a device was constructed using the conductive silicon portion of the substrate having a silicon dioxide film shown in FIG. 4 as a gate electrode 1, and the silicon dioxide portion as a gate insulating film 2.

On the substrate, a 15% by weight ethanol solution of 3-hexylthiophene was applied by the spin coating. The film thickness of the obtained monomer layer was about 150 nm.

The entire substrate was heated to and maintained at 50° C., and following the same pattern as in Example 1, a 0.20 mol/L aqueous solution of dilute sulfuric acid as an oxidizing agent was discharged and printed at 5 µL/cm² using a piezo-jet system. A polymerization reaction took place quickly immediately after the printing, and a blackened polymer film was obtained for use as an organic semiconductor.

After non-reacted monomers were washed and removed with ethanol, an aqueous solution of PEDOT (poly-ethylenedioxythiophene) (Nagase Chemtex Corporation; trade name: Denatron P-502S; concentration: 3.0% by weight) as a conductive polymer was applied using a piezo-jet method to form source/drain electrodes.

The obtained organic semiconductor device had such a structure as shown in FIG. 1, and the measured value of the channel length between the source and drain was 54 µm.

The carrier mobility, electric conductivity, and on/off ratio of the organic semiconductor devices fabricated in Examples 1 to 4 are collectively shown in Table 1 below. All the devices of Examples 1 to 4 showed switching characteristics wherein the drain-source current value ($I_{ds}$) of the current flowing between the source electrode, the organic semiconductor, and the drain electrode changes following the change of the voltage applied to the gate electrode (gate voltage: $V_G$) and had the function as organic semiconductor devices.

TABLE 1

| | Carrier Mobility | Electric Conductivity | On/Off Ratio |
|---|---|---|---|
| Example 1 | 1.0–4.9 × 10⁻³ cm²/Vs | 3–8 × 10⁻⁶ S/cm | 35–90 |
| Example 2 | 0.7–2.0 × 10⁻² cm²/Vs | 1–4 × 10⁻⁵ S/cm | 30–150 |
| Example 3 | 1.0–3.5 × 10⁻² cm²/Vs | 5–9 × 10⁻⁵ S/cm | 40–200 |
| Example 4 | 0.8–2.1 × 10⁻³ cm²/Vs | 1–3 × 10⁻⁶ S/cm | 10–30 |

The carrier mobility u shown in Table 1 was calculated using the following equation.

$$I_{ds} = (WC_i/2L)\mu(V_G - V_0)^2$$

wherein W is a channel width, L is a channel length, and $C_i$ is a capacitance (per unit area) of the gate insulating layer.

From the relationship between a square root of the drain-source current ($I_{ds}$) and the gate voltage ($V_G$) in the saturated region, the apparent threshold voltage ($V_0$) is determined by extrapolation using the measured values to $I_{ds}=0$. The $I_{ds}$ in the saturated region is determined by observing the relationship between the drain-source voltage ($V_{ds}$) and the drain-source current at a given $V_G$. The $I_{ds}$ in the saturated region refers to the $I_{ds}$ that does not increase any more even when the drain-source voltage is elevated. The $I_{ds}$ in the saturated region varies together with $V_G$. The method of determining the $V_0$ is well known to those skilled in the art.

The conductivity shown in Table 1 was determined using the following equation.

$$\sigma = C_i V_0 \mu / d$$

wherein $C_i$ is a capacitance of the insulating layer, $V_0$ is the apparent threshold voltage, µ is the carrier mobility, and d is the thickness of the organic semiconductor polymer film.

The on/off ratio is a ratio of the drain current flowing in the saturated state when the gate voltage ($V_G$) is more than the drain voltage ($V_D$), to the drain current flowing when $V_G$ is 0.

INDUSTRIAL APPLICABILITY

As is seen from the above description, according to the present invention, an organic semiconductor device comprising a gate insulating layer, a gate electrode, a source electrode, a drain electrode, and an organic semiconductor layer is produced. According to this production method, an organic semiconductor device having an optional configuration can easily be produced at low cost.

The invention claimed is:

1. A method of producing an organic semiconductor device comprising a gate insulating layer, a gate electrode, a source electrode, a drain electrode, and an organic semiconductor layer, the method comprising the steps of:
   1) forming a monomer layer on the gate insulating layer, the monomer layer comprising a precursor monomer of a conductive or semiconductive polymer;
   2) maintaining the monomer layer at a given temperature; and
   3) applying an oxidizing agent solution to a desired location of the monomer layer to obtain a polymer layer of a desired conductivity.

2. The method of producing an organic semiconductor device according to claim 1, wherein the step 2) comprises the step of controlling the conductivity of the polymer layer by a reaction temperature to selectively form either a semiconductor layer portion or a source/drain electrode portion.

3. The method of producing an organic semiconductor device according to claim 1, wherein the oxidizing agent solution is applied to a given location in a given shape using an ink-jet system.

4. The method of producing an organic semiconductor device according to claim 1, wherein the monomer layer is applied to a given location in a given shape using an ink-jet system.

5. The method of producing an organic semiconductor device according to claim 1, wherein the precursor monomer comprises a pyrrole compound, and the oxidizing agent solution is an aqueous solution of an iron (III) compound represented by the general formula: $Fe_m X_n$, wherein X is $ClO_4^-$, $BF_4^-$, $PF_6^-$, $SbF_6^-$, $CH_3C_6H_4SO_3^-$, $CF_3SO_3^-$, $ZrF_6^{2-}$, $TiF_6^{2-}$, or $SiF_6^-$; and m and n are independently an integer of 1–3.

6. The method of producing an organic semiconductor device according to claim 1, wherein the precursor monomer comprises a thiophene compound.

* * * * *

UNITED STATES PATENT AND TRADEMARK OFFICE
CERTIFICATE OF CORRECTION

PATENT NO. : 7,026,231 B2  Page 1 of 1
APPLICATION NO. : 10/479364
DATED : April 11, 2006
INVENTOR(S) : Makoto Kubota et al.

It is certified that error appears in the above-identified patent and that said Letters Patent is hereby corrected as shown below:

COLUMN 3:
Line 28, "1contacts" should read -- 1 contacts --.

COLUMN 4:
Line 41, "3-chlorothiophenes, 3,4-dichlo-" should be deleted;
Line 42, "rothiophenes, and the like." should be deleted; and
Line 45, "and" should read -- 3-chlorothiophenes, 3,4-dichlorothiophenes, and --.

COLUMN 9:
Line 58, "mobility u" should read -- mobility μ --.

Signed and Sealed this

Eighth Day of May, 2007

JON W. DUDAS
*Director of the United States Patent and Trademark Office*